United States Patent
Tateiwa et al.

(10) Patent No.: US 8,901,725 B2
(45) Date of Patent: Dec. 2, 2014

(54) WIRING BOARD AND METHOD OF MANUFACTURING THE SAME, AND SEMICONDUCTOR DEVICE AND METHOD OF MANUFACTURING THE SAME

(75) Inventors: Akihiko Tateiwa, Nagano (JP); Masahiro Kyozuka, Nagano (JP); Fumimasa Katagiri, Tempe, AZ (US)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 98 days.

(21) Appl. No.: 13/048,190

(22) Filed: Mar. 15, 2011

(65) Prior Publication Data
US 2011/0227214 A1    Sep. 22, 2011

(30) Foreign Application Priority Data

Mar. 18, 2010 (JP) ................. 2010-061899

(51) Int. Cl.

| H01L 23/02 | (2006.01) |
|---|---|
| H01L 21/683 | (2006.01) |
| H01L 23/00 | (2006.01) |
| H05K 3/46 | (2006.01) |
| H01L 29/40 | (2006.01) |
| H05K 3/34 | (2006.01) |
| H01L 21/56 | (2006.01) |

(52) U.S. Cl.
CPC ....... *H01L 24/81* (2013.01); *H01L 2221/68345* (2013.01); *H01L 2224/81192* (2013.01);
(Continued)

(58) Field of Classification Search
CPC ................. H01L 2924/1517; H01L 21/4857; H01L 23/49822; H01L 23/5383; H01L 21/486; H01L 23/481; H01L 23/5226; H01L 2224/20; H01L 2224/211

USPC .......... 257/686, 678, E23.041, E23.062, 257/E23.145, E23.173, 750, 774, 778, 257/E23.174, 734
See application file for complete search history.

(56) References Cited

U.S. PATENT DOCUMENTS 5,778,523 A * 7/1998 Sylvester .................. 29/831
6,317,331 B1 * 11/2001 Kamath et al. ............ 361/760
(Continued)

FOREIGN PATENT DOCUMENTS

| JP | 2002-280478 | * 9/2002 | ........... H01L 23/12 |
|---|---|---|---|
| JP | 2002-280478 A | 9/2002 | |

(Continued)

OTHER PUBLICATIONS

Schott, Technical Information. Optics for Devices. 2004, pp. 1-10.*

(Continued)

*Primary Examiner* — Galina Yushina
(74) *Attorney, Agent, or Firm* — Kratz, Quintos & Hanson, LLP

(57) ABSTRACT

A wiring board has a structure where multiple wiring layers are stacked one on top of another with insulating layers interposed therebetween. A sheet-shaped member is buried in an outermost insulating layer located on a side of the structure opposite to a side on which a semiconductor element is to be mounted. The sheet-shaped member has a modulus of elasticity and a coefficient of thermal expansion which are similar to a modulus of elasticity and a coefficient of thermal expansion of the semiconductor element. The sheet-shaped member is made of a material having a modulus of elasticity and a coefficient of thermal expansion which are enough to bring respective distributions thereof into a substantially symmetric form in a direction orthogonal to a surface of the wiring board in the case where the semiconductor element is mounted.

6 Claims, 9 Drawing Sheets

(52) U.S. Cl.
CPC ..... *H05K 3/3436* (2013.01); *H01L 2224/04105* (2013.01); *H01L 2924/01079* (2013.01); *H01L 2224/73204* (2013.01); *H01L 2924/014* (2013.01); *H01L 2924/01019* (2013.01); *H01L 2924/01011* (2013.01); *H01L 2924/01006* (2013.01); *H01L 2924/01033* (2013.01); *H01L 2224/32225* (2013.01); *H01L 2924/01068* (2013.01); *H01L 2924/01029* (2013.01); *H01L 2924/10253* (2013.01); *H01L 2924/01005* (2013.01); *H01L 2924/15311* (2013.01); H01L 21/6835 (2013.01); *H01L 2924/01074* (2013.01); *H01L 2924/01013* (2013.01); H01L 24/19 (2013.01); *H01L 2224/83102* (2013.01); *H01L 2924/09701* (2013.01); *H01L 21/563* (2013.01); *H01L 2224/92125* (2013.01); H05K 3/4682 (2013.01); *H05K 2201/09136* (2013.01); *H01L 2924/01046* (2013.01); *H01L 2224/211* (2013.01); *H01L 2224/20* (2013.01); *H01L 1/0271* (2013.01); *H01L 2224/16225* (2013.01); *H01L 2224/16227* (2013.01); *H01L 2924/01078* (2013.01); *H01L 2924/01024* (2013.01); *H01L 2224/81801* (2013.01)
USPC ........... 257/686; 257/750; 257/734; 257/774; 257/E23.062; 257/E23.145

(56) References Cited

U.S. PATENT DOCUMENTS

| | | | |
|---|---|---|---|
| 6,323,439 B1 * | 11/2001 | Kambe et al. | 174/262 |
| 6,525,921 B1 * | 2/2003 | Nakatani et al. | 361/306.3 |
| 7,094,975 B2 * | 8/2006 | Chengalva et al. | 174/256 |
| 7,473,992 B2 * | 1/2009 | Ogawa | 257/686 |
| 2004/0046244 A1 | 3/2004 | Nakamura | |
| 2005/0087860 A1 | 4/2005 | Nakamura | |
| 2007/0148467 A1 * | 6/2007 | St. Lawrence et al. | 428/411.1 |
| 2008/0038577 A1 * | 2/2008 | Kruger et al. | 428/598 |
| 2009/0072394 A1 | 3/2009 | Onodera et al. | |
| 2010/0025093 A1 * | 2/2010 | Maruyama et al. | 174/258 |

FOREIGN PATENT DOCUMENTS

| | | |
|---|---|---|
| JP | 2003-142617 A1 | 5/2003 |
| JP | 2007-149731 A1 | 6/2007 |
| JP | 2008-211125 A | 9/2008 |
| JP | 2010-50154 A | 3/2010 |

OTHER PUBLICATIONS

Melles Griot. Material Properties, part 4.1 published online in 2009.*
Japanese Office Action mailed Sep. 3, 2013, with English Translation, in counterpart Japanese Application No. 2010-061899.

* cited by examiner

WIRING BOARD AND METHOD OF MANUFACTURING THE SAME, AND SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2010-061899, filed on Mar. 18, 2010, the entire contents of which are incorporated herein by reference.

FIELD

The embodiments discussed herein are related to a wiring board and a method of manufacturing the same, and also to a semiconductor device in which a semiconductor element is mounted on a wiring board, and to a method of manufacturing the same.

Such a wiring board has a semiconductor element mounted thereon in a semiconductor device, and thus the wiring board is hereinafter also referred to as a "semiconductor package" or simply a "package", for the sake of convenience.

BACKGROUND

As a technique of manufacturing a wiring board of multi-layer structure, a build-up method has been widely used. The build-up method typically includes the processes of sequentially forming insulating layers and wiring layers repeatedly on both sides of a core substrate. In such a structure, the wiring layers and the insulating layers can be formed to be thin because these layers are stacked by the build-up method. On the other hand, the core substrate requires a thickness large enough for the wiring board to have a certain rigidity. This limits a reduction in thickness of the entire package.

To achieve a further reduction in thickness of the wiring board (semiconductor package), a structure without a core substrate has been employed in recent years. The wiring board having such a structure is called a "coreless substrate", because the wiring board has no core.

However, a thin substrate such as a coreless substrate involves a problem in that rigidity of the entire substrate is low and thus the substrate easily warps, because there is no core. A considerable extent of warp is observed due to the application of considerable heat to the substrate especially during processes of reflow soldering for connecting terminals of the chip and the substrate and filling an underfill resin during mounting of a semiconductor element (typically, silicon (Si) chip), and reflow soldering during secondary mounting (mounting, on a mother board or the like, the substrate on which the chip is mounted).

Some measures are taken to cope with such an inconvenience. One of the measures is to provide a relatively thick reinforcing member, such as a glass cloth layer, a prepreg layer, or the like, in a substrate, so as to increase the rigidity of the substrate and to suppress a warp of the substrate. In another method, wiring layers in the substrate are designed to have different wiring patterns so that the ratio of a copper (Cu) wiring in each layer is adjusted for a reduction in warp.

As a technique related to the above art, for example, there is known a package for semiconductor device 50 (FIG. 1) which is described in Japanese Laid-open Patent Publication No. 2003-142617 (Patent Document 1). As another technique related to the above art, there is known a semiconductor device 110 (FIG. 35) which is described in Japanese Laid-open Patent Publication No. 2007-149731 (Patent document 2).

As described above, in the state of the art, a thin substrate such as a coreless substrate is advantageous in terms of a reduction in thickness, because the substrate does not need a core base member. On the other hand, a low rigidity of the entire substrate leads to a problem in that the substrate easily warps at the time of mounting a semiconductor element or at the secondary mounting. To cope with this, various measures have been taken heretofore.

However, it is the existing state that the measure of providing a relatively thick reinforcing member, such as a glass cloth layer or the like, in a substrate cannot suffice as a measure for the warp, because the modulus of elasticity and the coefficient of thermal expansion (CTE) of the reinforcing member are different from those of a semiconductor element (of silicon constituting its substrate) to be mounted. Moreover, in the measure of designing wiring layers in the substrate to have different wiring patterns so that the ratio of copper (Cu) in each layer is adjusted, there is a disadvantage in that the adjustment required for each layer is troublesome and thus is not easy.

SUMMARY

According to a first aspect of the invention, there is provided a wiring board including a laminated structure in which a plurality of wiring layers are stacked one on top of another with insulating layers interposed therebetween, and a sheet-shaped member buried in an outermost insulating layer of the laminated structure, the outermost insulating layer being located on a side opposite to a side on which a semiconductor element is to be mounted, wherein the sheet-shaped member has a modulus of elasticity and a coefficient of thermal expansion which are similar to a modulus of elasticity and a coefficient of thermal expansion of the semiconductor element.

According to a second aspect of the invention, there is provided a method of manufacturing a wiring board, including forming a pad on a base substrate, forming an insulating layer on the base substrate in such a manner as to cover the pad, forming a wiring layer on the insulating layer, so as to be electrically connected to the pad through a via hole formed in the insulating layer, alternately stacking insulating layers and wiring layers and then exposing a first insulating layer, laminating a sheet-shaped member having an opening portion on the first insulating layer, the sheet-shaped member being made of a material having a modulus of elasticity and a coefficient of thermal expansion which are similar to a modulus of elasticity and a coefficient of thermal expansion of a semiconductor element to be mounted, forming a second insulating layer on the first insulating layer in such a manner as to cover the sheet-shaped member having the opening portion, forming an outermost wiring layer on the second insulating layer, so as to be electrically connected to an underlying wiring layer through a via hole formed through a portion of the first insulating layer and the second insulating layer, the portion corresponding to the position of the opening portion, and removing the base substrate.

According to a third aspect of the invention, there is provided a semiconductor device including a laminated structure in which a plurality of wiring layers are stacked one on top of another with insulating layers interposed therebetween, a semiconductor element buried in an outermost insulating layer on one side of the laminated structure, and a sheet-shaped member buried in an outermost insulating layer on another side of the laminated structure, the sheet-shaped member having a modulus of elasticity and a coefficient of thermal expansion which are similar to a modulus of elasticity and a coefficient of thermal expansion of the semiconductor element.

According to a fourth aspect of the invention, there is provided a method of manufacturing a semiconductor device, including mounting a semiconductor element on a base substrate, with a surface of the semiconductor element, on which an electrode terminal is formed, facing upward, forming an insulating layer on the base substrate in such a manner as to seal the semiconductor element, forming a wiring layer on the insulating layer, so as to be electrically connected to the electrode terminal through a via hole formed in a portion of the insulating layer, the portion corresponding to a position of the electrode terminal, alternately stacking insulating layers and wiring layers and then exposing a first insulating layer, laminating a sheet-shaped member having an opening portion on the first insulating layer, the sheet-shaped member being made of a material having a modulus of elasticity and a coefficient of thermal expansion which are similar to a modulus of elasticity and a coefficient of thermal expansion of the semiconductor element, forming a second insulating layer on the first insulating layer in such a manner as to cover the sheet-shaped member having the opening portion, forming an outermost wiring layer on the second insulating layer, so as to be electrically connected to an underlying wiring layer through a via hole formed through a portion of the first insulating layer and the second insulating layer, the portion corresponding to a position of the opening portion, and removing the base substrate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to the accompanying drawings.

(First Embodiment, See FIG. 1 to FIGS. 8A-8C)

Figure 1:
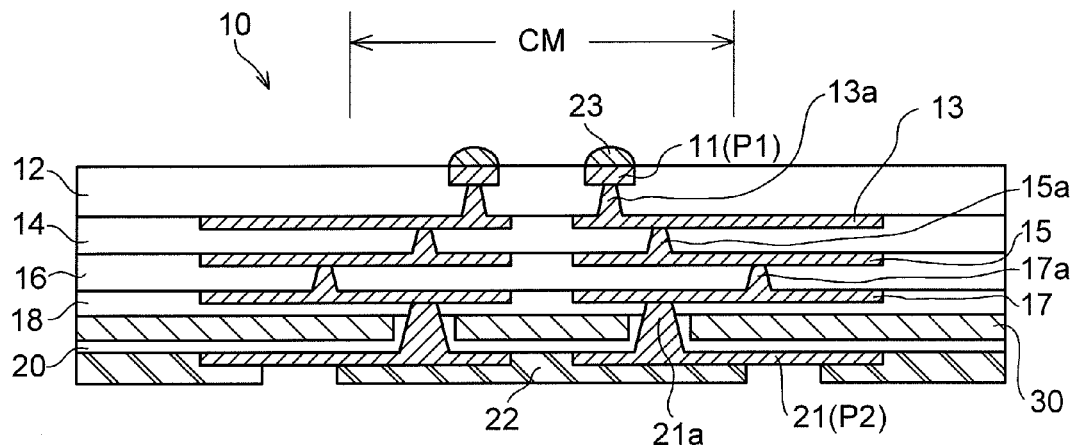
FIG. 1 is a cross-sectional view illustrating a configuration of a wiring board (semiconductor package) according to a first embodiment.
Figure 2:
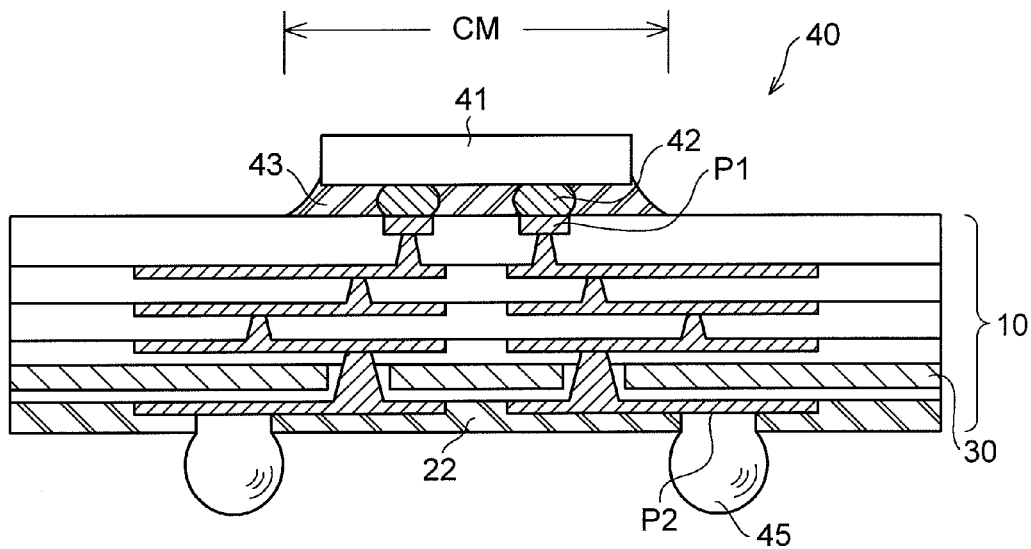
FIG. 2 is a cross-sectional view illustrating a configuration of a semiconductor device using the wiring board illustrated in FIG. 1.

FIG. 1 illustrates in a cross-sectional view, a configuration of a wiring board (semiconductor package) according to a first embodiment. FIG. 2 illustrates in a cross-sectional view, a configuration of a semiconductor device using the wiring board illustrated in FIG. 1.

Referring to FIG. 2, a wiring board (semiconductor package) 10 according to the embodiment has a semiconductor element 41 (e.g., silicon chip such as CPU) mounted on one surface of the wiring board, and external connection terminals (solder balls 45 in the illustrated example) bonded to the other surface of the wiring board on the opposite side to the one surface (semiconductor device 40).

The semiconductor element (chip) 41 mounted on the wiring board 10 is electrically connected at electrode pads (terminals) thereof to pads P1 via conductive members 42 such as solder bumps (flip-chip mounting). The pads P1 are exposed from the surface of the board 10 in a chip mount region CM. Further, an underfill resin 43 (thermosetting epoxy-based resin or the like) is filled in a gap between the mounted chip 41 and the wiring board 10, and is then cured. Thus the chip is fixed to the wiring board 10.

On the other hand, solder balls 45 are bonded to pads P2 exposed from the surface opposite to the surface on which the chip is mounted. The solder balls serve as external connection terminals for use in mounting the package 10 on a mount board such as a mother board. The example of FIG. 2 illustrates a ball grid array (BGA) structure where the solder balls 45 are bonded to the pads P2, but another structure such as pin grid array (PGA) where metal pins are bonded to the pads P2 may be employed. Alternatively, another structure such as land grid array (LGA) may be employed, where no external connection terminal (solder ball, metal pin or the like) is provided and the pads P2 are exposed to allow external connection terminals to be bonded thereto when necessary.

As illustrated in FIG. 1, the wiring board (package) 10 according to the embodiment has a structure in which a plurality of wiring layers 11, 13, 15, 17 and 21 are layered one on top of another with insulating layers (specifically, resin layers) 12, 14, 16, 18 and 20 interposed therebetween, and are interconnected via conductors (vias 13a, 15a, 17a and 21a) filled in via holes formed in the insulating layers. In other words, the package 10 does not have a form of a general build-up multilayer wiring board (one obtained by sequentially stacking build-up layers on both sides of a core base member), but has a form of a "careless substrate" without a core base member.

The plurality of pads P1 (portions defined at required positions in the wiring layer 11) are disposed in the chip mount region CM in an outermost resin layer (insulating layer 12) on one side (top side in the illustrated example) of the coreless substrate (wiring board 10). The pads P1 are arranged in a grid pattern when the chip mount region CM is viewed in plan. The pads P1 are provided in such a manner as to be exposed on the same level as the surface of the wiring board 10, as illustrated in FIG. 1. As illustrated in FIG. 2, the electrode pads (terminals) of the semiconductor element 41 are to be connected to the pads P1 via the solder bumps 42 or the like. For facilitation of the connection, each pad P1 is coated beforehand with an appropriate amount of solder 23.

On the other hand, a solder resist layer 22 functioning as a protection layer is formed on a side (bottom side in the illustrated example) opposite to the side in which the pads P1 are formed. The solder resist layer 22 is formed in such a manner as to cover an outermost wiring layer (wiring layer 21 in the illustrated example) while leaving portions exposed, the portions corresponding to pads P2 defined at required positions in the outermost wiring layer. The pad P2 is connected to the corresponding pad P1 in the chip mount region CM with the via 21a, the wiring layer (via 17a), the wiring layer 15 (via 15a) and the wiring layer 13 (via 13a) interposed therebetween. Each of the vias 13a, 15a, 17a and 21a in the wiring layers 13, 15, 17 and 21 is provided in the form of a truncated cone in such a manner that one end surface which is directed to the pad P1 has a smaller diameter than another end surface which is directed to the pad P2. As illustrated in FIG. 2, external connection terminals such as the solder balls 45 are to be bonded to the pads P2 exposed from the solder resist layer 22. Instead of using the solder balls or the like, the pads P2 themselves may be used as external connection terminals.

As materials for the insulating layers 12, 14, 16, 18 and 20, an epoxy-based resin, a polyimide-based resin, a phenol resin or the like, which are widely used as a build-up resin, can be preferably used. As for a material for the wiring layers 11, 13, 15, 17 and 21, copper (Cu) is typically used.

The pads P1 defined in the outermost wiring layer 11 and the pads P2 defined in the outermost wiring layer 21 are subjected to appropriate surface treatment so as to enhance their contact properties. This is because the electrode terminals of the semiconductor element 41 to be mounted on the package 10, and the solder balls 45 or the like, are bonded to the pads P1 and P2, respectively. For example, the pads P1 and P2 are subjected to nickel (Ni) plating and gold (Au) plating in this order, or subjected to Ni plating, palladium (Pd) plating and Au plating in this order. In short, each of the pads P1 and P2 has a layered structure of Cu/Ni/Au or Cu/Ni/Pd/Au.

Furthermore, a sheet-shaped member 30 is buried in the outermost insulating layer 20 on the opposite side to the side of the chip mounting surface of the package 10. The sheet-shaped member 30 is provided in order that a semiconductor device 40 obtained after mounting a semiconductor element (silicon chip 41) on the package (wiring board 10) has the modulus of elasticity and the coefficient of thermal expansion (CTE) each distributing in a substantially symmetric form in the up and down direction (i.e., the direction orthogonal to the surface of the board). In other words, the sheet-shaped member 30 has a function of decreasing a warp (reducing the amount of warp) of the entire device 40 by adjusting the modulus of elasticity and the CTE in the up and down direction in the state where the chip 41 is mounted (semiconductor device 40 illustrated in FIG. 2).

For this reason, it is desirable to use, for the sheet-shaped member 30, a material having a relatively high modulus of elasticity and a relatively low CTE so that the modulus of elasticity and the CTE become equivalent to the modulus of elasticity (about 193 GPa) and the CTE (about 3 ppm/K) of the silicon chip 41 mounted on the package 10. The use of such material leads to a reduction in CTE difference between the chip 41 and the wiring board 10, and thus can suppress the warp of the semiconductor device 40.

Note, the degree of suppression of the warp may somewhat vary depending on various factors such as the size of the wiring board 10, the number of the wiring layers, materials to be used, the position at which the sheet-shaped member 30 is provided, the thickness of the sheet-shaped member 30, and the like. In view of these factors, a material is selected in the embodiment, which has a modulus of elasticity within a range larger than 130 GPa and not larger than 500 GPa and has a CTE within a range not larger than 10 ppm $(10\times10^{-6})$/K in order that the extent of warp (amount of warp) allowable in any situation of a room temperature (25° C.) and a reflow temperature range (around 230 to 260° C.), is suppressed to 100 μm or smaller.

Accordingly, any material, irrespective of whether it is a metal or a non-metal, can be used for the material of the sheet-shaped member 30, as long as the material has the modulus of elasticity and the CTE which fall within the above ranges. For example, as metal materials, alloy 42 (alloy of 42 wt % nickel (Ni) and iron (Fe)), alloy 36, or kovar (alloy of 53% Fe, 28% Ni, and 18% cobalt (Co)) can be used. As non-metal materials, a carbon fiber cloth, ceramic material, or a silica glass can be used.

Consider a case where a metal material is employed for the sheet-shaped member 30. In this case, if the side surface portion of the sheet-shaped member 30 is exposed from the side surface of the wring board 10 as illustrated in FIG. 1 and FIG. 2, the side surface portion may be adversely affected, such as being oxidized. To surely avoid such an inconvenience, it is preferable that the side surface portion of the sheet-shaped member 30 is embedded in the board 10 so as not to be exposed.

Specific materials, sizes, thicknesses and the like of components constituting the package (wiring board 10) will be described as appropriate in the description of steps of the following process.

The method of manufacturing the wiring board (package) 10 according to the embodiment will be hereinafter described with reference to FIG. 3A to FIG. 6C illustrating an example of steps for manufacturing the wiring board 10.

First, in the initial step (see FIG. 3A), a temporary substrate (base substrate) BS serving as a base is prepared. A metal (e.g., copper (Cu)) which can be dissolved by an etchant is used as a material for the base substrate BS, considering that the base substrate BS is etched away eventually, as described later. Basically, a metal plate or a metal foil suffices for the base substrate BS. As a specific example of the base substrate BS, the form can be employed, such as disclosed in "Method of manufacturing wiring board and Method of manufacturing electronic component implementation structure" (Japanese Laid-open Patent Publication No. 2007-158174), which has previously been proposed by the applicant of the this application. Specifically, the structure obtained by heating and compressing a base layer and a copper foil disposed on a prepreg can be preferably used as the base substrate BS. Here the prepreg is an adhesive sheet obtained by impregnating a reinforcement glass cloth with a thermosetting resin such as an epoxy-based resin or a polyimide-based resin and bringing the resultant reinforcement glass cloth into a state of B stage or into a half-cured state.

In the next step (see FIG. 3B), the pads P1 (wiring layer 11) are formed at portions in the chip mount region CM on the base substrate BS. The pads P1 are used as external terminals when the chip 41 (FIG. 2) is mounted. The specific method of forming the pads P1 is described as follows.

First, a plating resist is formed using a patterning material on the base substrate BS and is then patterned into a required shape. Thus a resist layer is formed. The resist layer is formed into a pattern which includes opening portions corresponding to the shapes of the pads P1 to be formed.

A photosensitive dry film (of a structure in which a resist material is sandwiched between a polyester cover sheet and a polyethylene separator sheet), or a liquid photo resist (liquid resist such as a novolak-based resin or an epoxy-based resin) may be used as a patterning material. For example, in the case where a dry film is used, a required resist layer is formed in the following manner. First, a surface of the base substrate BS is cleansed, and then the dry film is laminated thereon by thermocompression bonding. The dry film is then subjected to exposure by an ultra violet (UV) irradiation by using a mask patterned into a required shape, and the dry film is thus cured. Further, cured portions of the dry film are etched away using a predetermined developer (to thus obtain opening portions). Thus the required resist layer is formed. In the case where a liquid photo resist is used, a plating resist (resist layer) can be formed through the similar steps.

Then, the pads P1 are formed on portions of the base substrate BS which are exposed from the opening portions of the plating resist, in such a manner as to correspond to the opening portions, by electrolytic plating in which the base substrate BS is used as a power feeding layer.

A material for constituting the pads P1 is selected from metals which are not dissolved by an etchant used for etching the base substrate BS, considering that the base substrate BS which is in contact with the pads P1 is eventually etched away. In the embodiment, among metals different from the material (Cu) of the base substrate BS, gold (Au) plating is applied, because the Au plating can secure a favorable conductivity. Furthermore, nickel (Ni) plating and copper (Cu) plating are applied in this order on the Au plated layer. Alternatively, palladium (Pd) plating may be applied before the application of the Ni plating. Such a plated layer structure is configured in order to enhance bonding between the pads P1 and wiring layers when the pads P1 are connected to the wiring layers through Cu vias in later steps, and in order to prevent Cu from dispersing into the Au plated layer. Namely, in this step, the pads P1 each formed of a three-layer structure of Au/Ni/Cu or a four-layer structure of Au/Pd/Ni/Cu are formed. Here, the layers of Au/Ni/Cu or Au/Pd/Ni/Cu are stacked in ascending order from the bottom layer.

Figure 3A:
FIGS. 3A to 3E are cross-sectional views illustrating an example of steps for manufacturing the wiring board illustrated in FIG. 1.
Figure 3B:
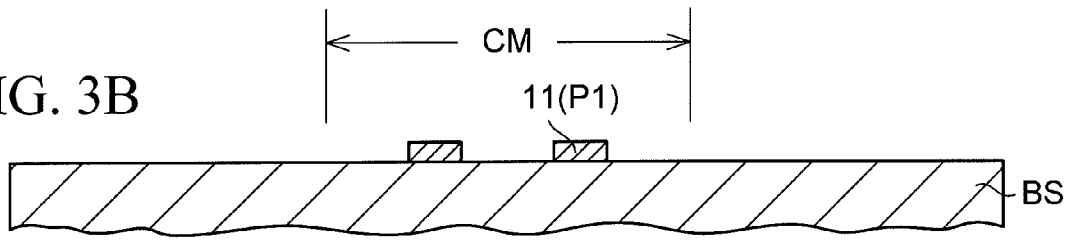

Then, the resist layer used as the plating resist is removed. For example, when a dry film is used as the plating resist, the resist can be removed by an alkaline solution such as sodium hydroxide or monoethanolamine-based solvent. When a liquid resist such as a novolak-based resin or an epoxy-based resin is used as the resist, the resist can be removed by acetone, alcohol, or the like. In this manner, a structure in which the pads P1 are formed on the base substrate BS is completed as illustrated in FIG. 3B.

In the next step (see FIG. 3C), the insulating layer 12 is formed to a thickness of approximately 30 μm on the base substrate BS on which the pads P1 are formed in such a manner as to cover the pads P1. A thermosetting epoxy-based resin, a thermosetting polyimide-based resin, or the like is used as a material for the insulating layer 12. A resin layer (insulating layer 12) can be formed in the following method, for example. An epoxy-based resin film is laminated on the base substrate BS and the pads P1, treated with heat at a temperature of 130 to 150° C. while being pressed, and thus cured.

In the next step (see FIG. 3D), via holes VH1 which respectively extend to the pads P1 are formed at required positions (portions corresponding to the positions of the pads P1 formed on the base substrate BS) of the insulating layer 12 by a hole making process using a carbon dioxide gas laser, an excimer laser, or the like. Although the via holes VH1 are formed using a laser in this step, required via holes can be formed by photolithography in a case where the insulating layer 12 is made of a photosensitive resin.

In the next step (see FIG. 3E), the wiring layer 13 which is to be connected to the underlying pads P1 is formed in a required pattern shape by a semi-additive method, an additive method, or the like, on the insulating layer 12 having the via holes VH1 (FIG. 3D) formed therein, while filling the via holes VH1 with the wiring layer 13 (vias 13a).

To be more specific, firstly, a copper (Cu) seed layer (not illustrated) is formed on the insulating layer 12, including the inside of the via holes VH1, by electroless plating, sputtering, or the like. Then, a resist film (not illustrated) is formed, which has opening portions corresponding to the shape of the wiring layer 13 to be formed. Next, the wiring layer 13 (including vias 13a) is formed to a thickness of approximately 5 μm to 10 μm on portions of the seed layer (Cu) which are exposed from the opening portions of the resist film, by electrolytic Cu plating in which the seed layer is used as a power feeding layer. Thereafter, the resist film is removed in the same manner as performed in the step illustrated in FIG. 3B. Furthermore, the exposed portions of the seed layer are removed by wet etching.

In this respect, when the Cu seed layer is removed, an upper layer portion of the wiring layer (Cu) 13 is also removed at the same time. The removal of the upper layer portion, however, does not involve a problem of disconnection or the like in the wiring layer 13 since the wiring layer 13 is quite thicker than the seed layer.

Figure 3C:
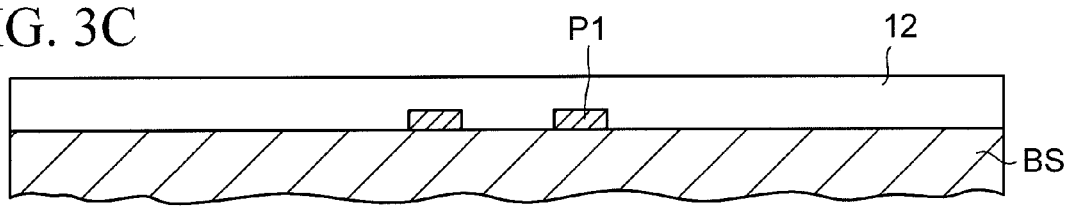
Figure 3D:
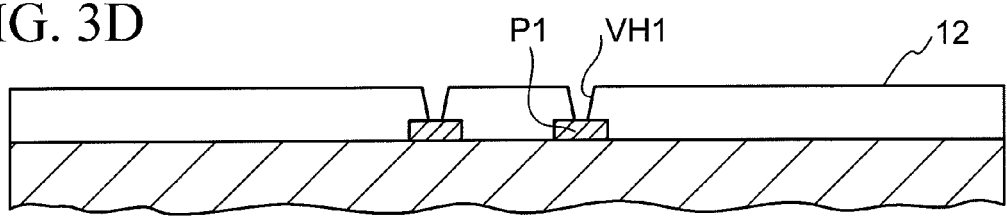
Figure 3E:
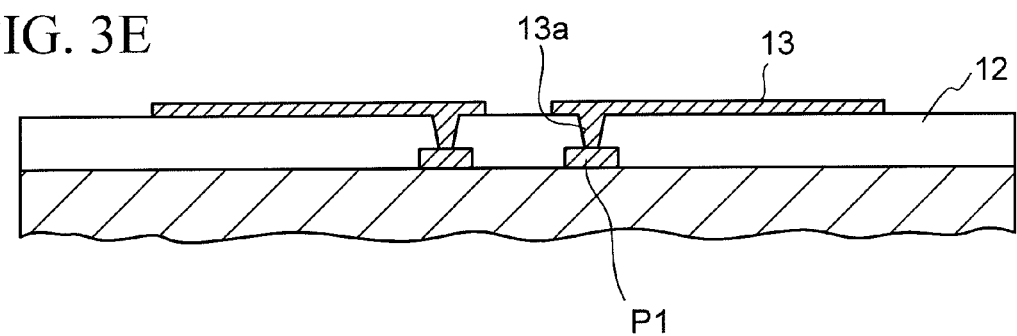

In the next step (see FIG. 4A), in the same manner as the processing performed in the steps illustrated in FIG. 3C to FIG. 3E, insulating layers and wiring layers are alternately layered one on top of another until a required number of layers are obtained. In the embodiment, two insulating layers and two wiring layers, i.e., the insulating layers 14 and 16 and the wiring layers 15 and 17, are stacked one on top of another. First, a resin layer (insulating layer 14) is formed on the insulating layer 12 and the wiring layer 13. Then, via holes are formed in the insulating layer 14, the via holes respectively extending to portions of pads defined at required positions of the wiring layer 13. Then, the wiring layer 15 which is to be connected to the pads is formed in a required pattern shape, while filling the via holes with the wiring layer 15 (forming the vias 15a). Furthermore, a resin layer (insulating layer 16) is formed on the insulating layer 14 and the wiring layer 15. Then, via holes are formed in the insulating layer 16, the via holes respectively extending to portions of pads defined at required positions of the wiring layer 15. Then, the wiring layer 17 which is to be connected to the pads is formed in a required pattern shape, while filling the via holes with the wiring layer 17 (forming the vias 17a).

In the next step (see FIG. 4B), in the same manner as the processing performed in the step illustrated in FIG. 3C, a resin layer (insulating layer 18) is formed to a thickness of approximately 15 μm on the exposed portions of the insulating layer 16 and the wiring layer 17 in such a manner as to cover the wiring layer 17.

In the next step (see FIG. 4C), a sheet-shaped member 30 is laminated on the resin layer (insulating layer 18), the sheet-shaped member 30 made of a material having a modulus of elasticity and a CTE within the predetermined ranges as described above. For example, a metal plate 30 made of alloy 42 (alloy of 42 wt % Ni and Fe) with a thickness of approximately 50 μm is stacked.

The metal plate (sheet-shaped member) 30 made of alloy 42 is basically stacked in such a manner as to be bonded to the resin layer 18 by thermal compression (by being heated and compressed). For example, at the same time as when the resin layer 18 is heated and compressed for curing, the sheet-shaped member 30 is thermally compressed, bonded to and stacked on the resin layer 18. For this reason, it is preferable that the surface of the metal plate 30 is set to a roughed state prior to heating and compressing in order that the metal plate 30 achieves favorable bonding to the underlying resin layer 18 (an epoxy-based resin film or the like). Examples of processing steps in this case are illustrated in FIG. 7 and FIG. 8.

Figure 7A:
FIGS. 7A to 7C are cross-sectional views illustrating an example of steps for additionally explaining the process performed in the step illustrated in FIG. 4C.
Figure 7B:
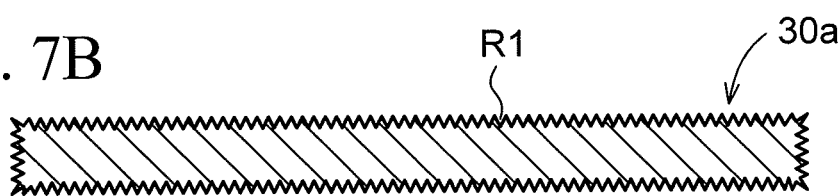
Figure 7C:
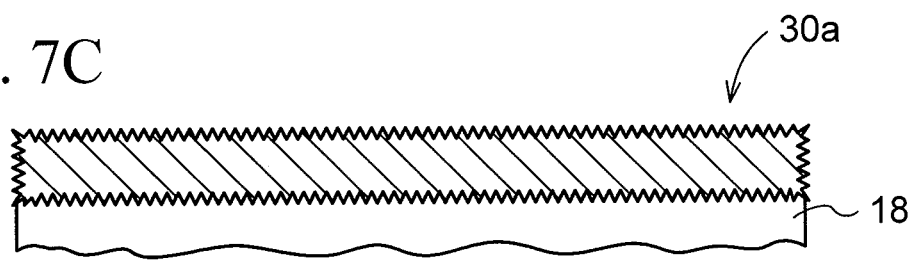
Figure 8A:
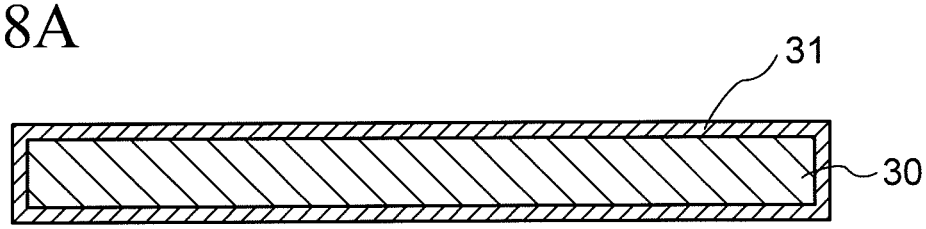
FIGS. 8A to 8C are cross-sectional views illustrating another example of steps for additionally explaining the process performed in the step illustrated in FIG. 4C.
Figure 8B:
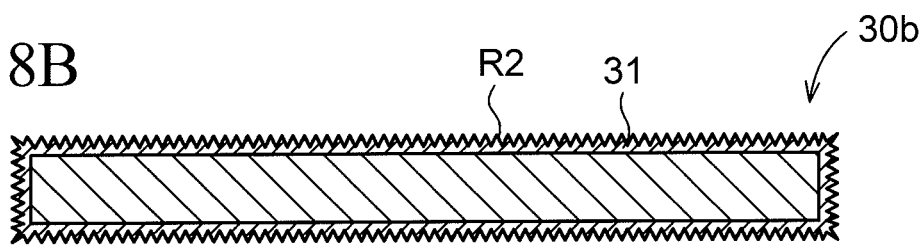
Figure 8C:
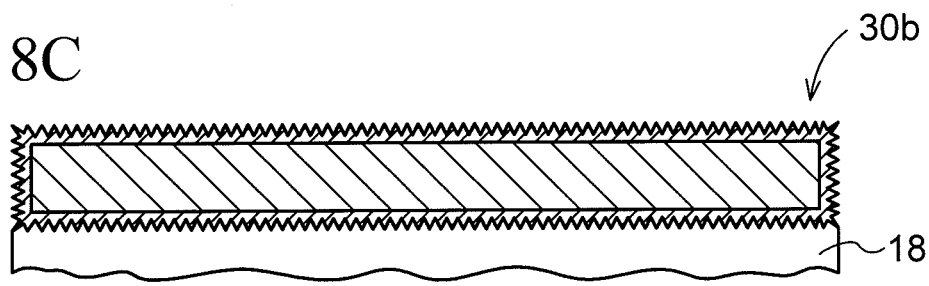

The method illustrated in FIG. 7 includes the following steps: (a) preparing a metal plate 30 made of alloy 42 with a required thickness; (b) roughing the surface of the metal plate 30 by etching or by other processing and thus forming a roughed portion R1; and (c) overlaying the metal plate 30a having the roughed portion R1 formed thereon on the resin layer 18, and bonding the metal plate 30 to the resin layer 18 by thermal compression. Meanwhile, the method illustrated in FIG. 8 includes the following steps: (a) preparing a metal plate 30 made of alloy 42 with a required thickness and applying Cu plating on the surface of the metal plate 30 to thus form a plated film 31; (b) roughing the surface of the plated film 31 by etching or by other processing and thus forming a roughed portion R2; and (c) overlaying the metal plate 30b having the roughed portion R2 formed thereon on the resin layer 18, and bonding the metal plate 30 to the resin layer 18 by thermal compression.

In the next step (see FIG. 5A), opening portions OP are formed at required positions of the metal plate (sheet-shaped member) 30 made of alloy 42. The size of the opening portions OP is determined to be larger than the opening diameter (maximum value) of via holes VH2 to be formed in a later step.

The opening portions OP can be formed by a subtractive method. First, a resist layer (etching resist ER) is formed on the metal plate 30, the resist layer being patterned to have openings corresponding to the opening portions OP to be formed. Then, the etching resist ER is used as a mask, and the exposed portion of the metal plate 30 is removed by wet etching (to thus form the opening portions OP). Thereafter, the etching resist ER is removed.

In the next step (see FIG. 5B), the insulating layer 20 is formed on the exposed portions of the insulating layer 18 and the metal plate 30 in such a manner as to fill in the opening portions OP (FIG. 5A) in the metal plate 30. The thickness of the insulating layer 20 is determined in such a manner that a portion of the insulating layer 20 on top of the metal plate 30 has a thickness of approximately 15 μm.

In the next step (see FIG. 5C), in the same manner as the processing performed in the step illustrated in FIG. 3D, via holes VH2 which extend to the underlying wiring layer 17 (to portions corresponding to their pads) are formed at required positions (portions corresponding to the positions of the opening portions OP (FIG. 5A) in the metal plate 30) of the insulating layer 20 by a hole making process using a carbon dioxide gas laser, an excimer laser, or the like. In this event, the insulating layers 18 and 20 are exposed on the inner wall surface of the via holes VH2, but the side surface of the metal plate 30 is not exposed thereon. This is because the size of the opening portions OP in the metal plate 30 is determined to be larger than the opening diameter (maximum value) of the via holes VH2.

In the next step, (see FIG. 6A), in the same manner as the processing performed in the step illustrated in FIG. 3E, the wiring layer 21 which is to be connected to the underlying wiring layer 17 (to portions corresponding to their pads) is formed in a required pattern shape by a semi-additive method or the like on the insulating layers 18 and 20 having the via holes VH2 (FIG. 5C) formed therein, while filling the via holes VH2 with the wiring layer 21 (vias 21a). The pads P2 are defined at required positions of the wiring layer 21. The wiring layer 21 serves as an outermost wiring layer of the package (wiring board 10).

In the next step (see FIG. 6B), a solder resist layer 22 is formed to a thickness of approximately 15 μm to 30 μm on a surface of the package on a side the wiring layer 21 (pads P2) is formed, in such a manner as to cover the surface (insulating layer 20 and wiring layer 21) but leave the portions for the pads P2 exposed. The solder resist layer 22 is made of a photosensitive epoxy acrylic-based resin, for example. The solder resist layer 22 can be formed by applying the resin resist (or by laminating one obtained by forming the resin resist into a film) to the surface and by patterning the resin resist into a required shape. This patterning involves forming opening portions (having the diameter of approximately 250 μm) in the solder resist layer 22, and the pads P2 of the wiring layer 21 are thus exposed from the opening portions. Furthermore, an appropriate surface treatment (Ni/Au plating or the like) is applied to the exposed pads P2.

In the final step (see FIG. 6C), the base substrate BS (FIG. 6B) used as a temporary substrate is removed. For example, the base substrate (Cu) BS can be removed by being selectively etched, while the exposed pads P1 and P2 (each having an Au plating layer formed on a top layer portion thereof), the exposed resin layer (insulating layer 12), and the exposed solder resist layer 22 are subjected to wet-etching by using a ferric chloride solution, a cupric chloride solution, an ammonium persulfate solution, or the like.

Further, an appropriate amount of solder 23 (FIG. 1) is applied on each of the pads P1 on the exposed surface. Then, the illustrated structure is cut and divided into individual packages by use of a dicer or the like. Thus the wiring board 10 according to the embodiment can be obtained.

Figure 4A:
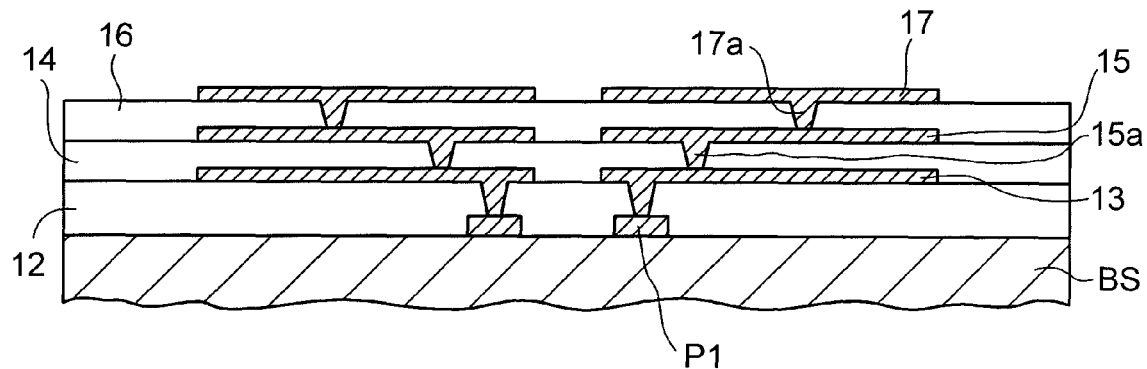
FIGS. 4A to 4C are cross-sectional views illustrating manufacturing steps following the steps illustrated in FIGS. 3A to 3E.
Figure 4B:
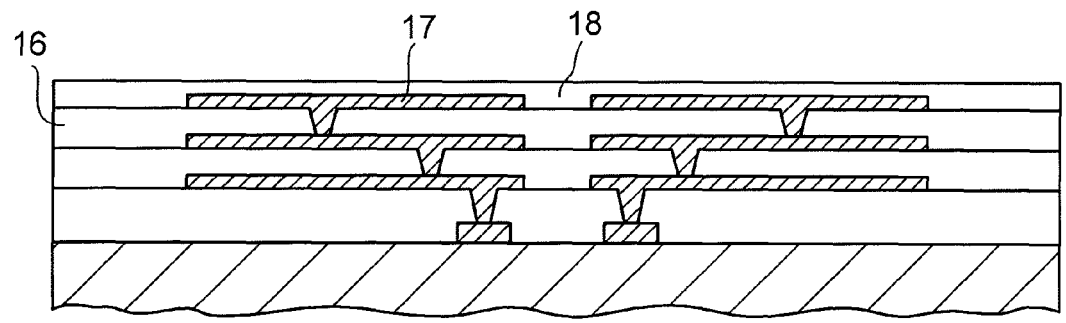
Figure 4C:
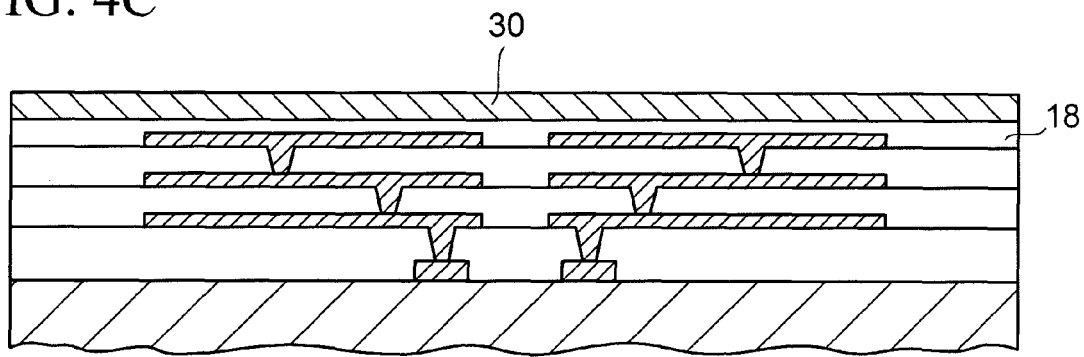
Figure 5A:
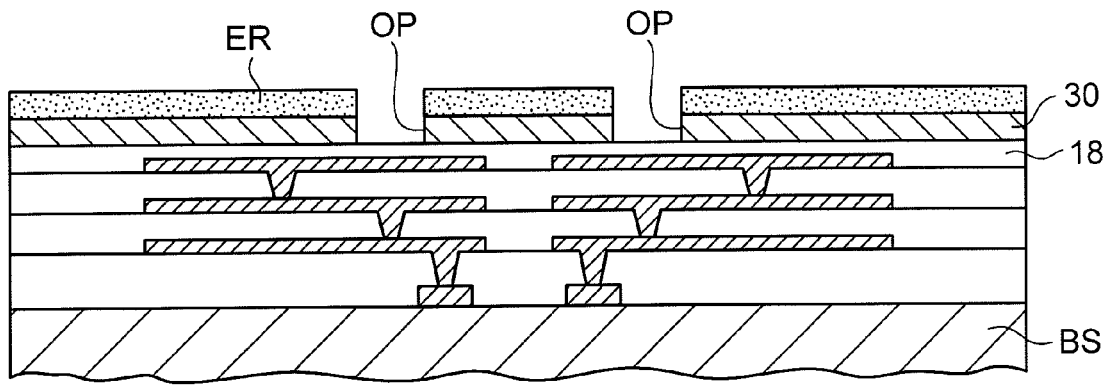
FIGS. 5A to 5C are cross-sectional views illustrating manufacturing steps following the steps illustrated in FIGS. 4A to 4C.
Figure 5B:
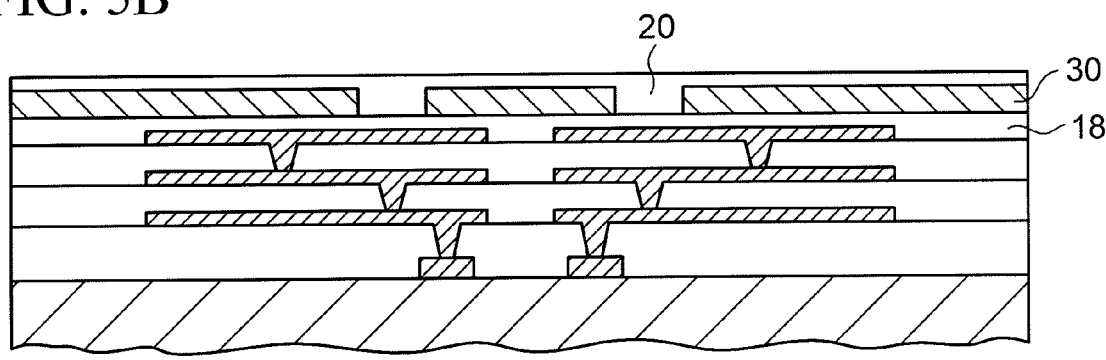
Figure 5C:
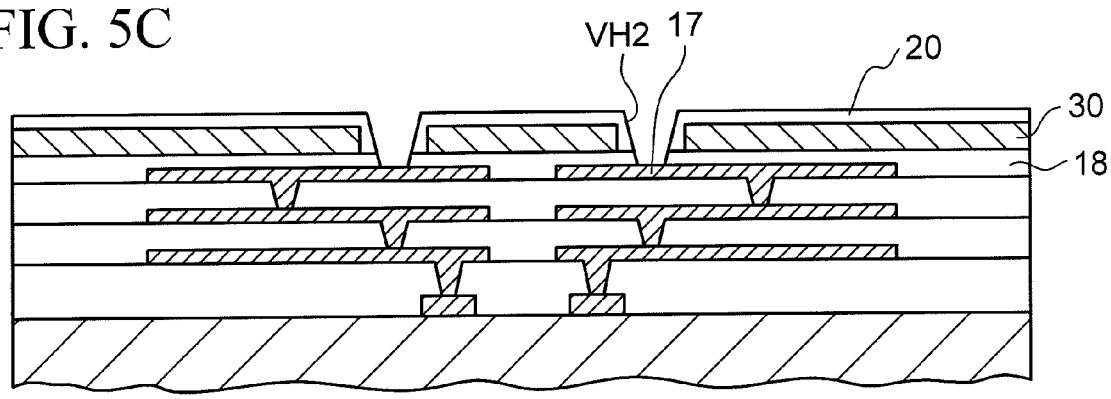

The above manufacturing method has been described by taking as an example the case where alloy 42 is employed as a material for the sheet-shaped member 30 stacked on the resin layer (insulating layer) 18, in the step illustrated in FIG. 4C. However, the material for the sheet-shaped member 30 is not limited thereto as a matter of course. In sum, a material suffices for the sheet-shaped member 30 as far as the material has the modulus of elasticity (larger than 130 GPa, and not larger than 500 GPa) and the CTE (10 ppm/K or smaller) which are within the predetermined ranges as described above. As other metal materials, kovar or alloy 36 may be used. In addition, as non-metal materials, a carbon fiber cloth or a silica glass may be used.

In the case where a non-metal material (e.g., carbon fiber cloth) is employed as the material for the sheet-shaped member 30, the member which is obtained by impregnating the carbon fiber cloth beforehand with a resin material being in a state of B stage (i.e., a sheet-shaped member) is laminated on the resin layer 18, as in the case of the prepreg. In this case, required opening portions OP are formed in the sheet-shaped member 30 made of the non-metal material, using a carbon dioxide gas laser or the like, instead of the method performed in the step illustrated in FIG. 5A.

As described above, according to the wiring board (semiconductor package) 10 and the semiconductor device 40 using the same according to the embodiment, the wiring board has the structure in which a plurality of wiring layers 11, 13, 15, 17, and 21 are stacked one on top of another with the resin layers (insulating layer) 12, 14, 16, 18, and 20 interposed therebetween and are interconnected through the via 13a, 15a, 17a, and 21a formed in the insulating layers. The structure further includes the sheet-shaped member 30 buried in a predetermined position in the board 10 (inside the insulating layer 20 which is the outermost insulating layer located on the opposite side from the chip mounting surface side), the sheet-shaped member 30 made of a material having the modulus of elasticity and the CTE within the afore-mentioned predetermined ranges.

In other words, the board 10 (device 40) has the form of a coreless substrate adapted for a thin substrate. On the other hand, the structure is reinforced by the existence of the sheet-shaped member 30 buried at a predetermined position in the board 10. Thus the board (entire device) has high rigidity.

With this structure, the sheet-shaped member 30 functions in such a manner that the modulus of elasticity and the CTE each distribute in a substantially symmetric manner in the up and down direction (direction orthogonal to the surface of the board) not only when being in the room temperature (around 25° C.) condition, but also when being applied heat (around 230 to 260° C.) during reflow soldering for terminal connection. Specifically, the reflow soldering for terminal connection is performed during mounting the silicon chip 41 on the package (wiring board 10) (FIG. 2) or during mounting, on a mother board or the like, the package (semiconductor device 40 in FIG. 2) on which the chip has been mounted (during secondary mounting). Thus the sheet-shaped member 30 is capable of sufficiently coping with occurrence of the warp of the board (entire device). Specifically, the sheet-shaped member 30 is almost buried throughout the insulating layer 20, and thus is capable of decreasing the extent of the warp (reducing the amount of the warp) which may otherwise occur.

Moreover, the structure can prevent the mounted chip 41 from being damaged. Specifically, in the conventional package structure, a chip may be cracked or subjected to other damages due to a stress caused by a phenomenon in which an outer region around a chip mount region on the package warps (deforms) more than an area within the chip mount region. Particularly, a chip having an interlayer insulating layer made of a Low-k material (low dielectric-constant material) for increasing the processing speed (speed for transmitting signals between wiring layers) exhibits the above inconvenience significantly, since the Low-k material generally is low in modulus of elasticity (weak in terms of rigidity). On the other hand, the board (entire device) of the embodiment has a higher rigidity with the existence of the sheet-shaped member 30, and thus is capable of preventing an inconvenience such as the damage to the chip 41.

Furthermore, the package (coreless substrate) 10 of the embodiment can be formed to be relatively thinner than a conventional "coreless substrate" which includes a relatively thick reinforcing member, such as a glass cloth layer or a prepreg layer, in the substrate to increase its rigidity. This is because the thickness of the sheet-shaped member 30 having functions equivalent to those of the conventional reinforcing member is approximately 50 μm, at the most.

The inventors of this application conducted comparative experiments between a structure of "Embodiment" and a structure of "Comparative Example" under the conditions below, in order to confirm an effect for warp reduction obtained by the embodiment.

A model structure subjected to the experiments was similar to the structure of the semiconductor device 40 illustrated in FIG. 2. Unlike the structure in FIG. 2, however, the layered structure included six wiring layers and six insulating layers, and the solder balls 45 were omitted. Furthermore, the portions of the pads P1 to which the silicon chip 41 is to be connected were not included in the wiring layers subjected to the experiments, and the solder resist layer 22 was not included in the insulating layers subjected to the experiments. Specifically, the model structure subjected to the experiments was as represented below.

| Structure of "Comparative Example" | Structure of "Embodiment" |
|---|---|
| Si chip | Si chip |
| underfill resin layer | underfill resin layer |
| pads (P1) | pads (P1) |
| insulating resin layer | insulating resin layer |
| first wiring layer | first wiring layer |
| insulating resin layer | insulating resin layer |
| second wiring layer | second wiring layer |
| insulating resin layer | insulating resin layer |
| third wiring layer | third wiring layer |
| insulating resin layer | insulating resin layer |
| fourth wiring layer | fourth wiring layer |
| insulating resin layer | insulating resin layer |
| fifth wiring layer | fifth wiring layer |
| insulating resin layer | insulating resin layer |
|  | sheet-shaped member with high modulus of elasticity and low CTE |
|  | insulating resin layer |
| sixth wiring layer | sixth wiring layer |
| solder resist layer | solder resist layer |

Specific properties of components constituting this structure are given as follows: outer dimension of a product (semiconductor device) is 12.5 mm×12.5 mm; the dimension of a mounted Si chip is 9 mm×9 mm; the thickness, the modulus of elasticity, and the CTE of the Si chip are 75 μm, 193 GPa, and 3 ppm/K, respectively; the thickness, the modulus of elasticity, and the CTE of the underfill resin layer are 30 μm, 8 GPa, and 35 ppm/K, respectively; the thickness, the modulus of elasticity, and the CTE of each of the first to sixth wiring layers (Cu) are 15 μm, 110 to 130 GPa, and 17 ppm/K, respectively; the thickness, the modulus of elasticity, and the CTE of each of the insulating resin layers (epoxy-based resin) are 30 to 40 μm, 3 to 4 GPa, and 45 to 50 ppm/K, respectively; Alloy 42 is employed as a material of the sheet-shaped member; and the thickness, the modulus of elasticity, and the CTE of the sheet-shaped member are 50 μm, 160 GPa, and 5.2 ppm/K, respectively.

In the structure of "Embodiment," the insulating resin layers interposed between the fifth wiring layer and the sixth wiring layer have the sheet-shaped member buried therein, and the sheet-shaped member has a high modulus of elasticity and a low CTE. Each of the insulating resin layers has a thickness of 15 μm, and the material and physical properties thereof are the same as those of the other insulating resin layers.

The structures (each having an Si chip mounted thereon) having the afore-mentioned properties were each measured for its extent of warp and for the shape of the warp when being in the room temperature (around 25° C.) and when being subjected to reflow soldering (around 260° C.). The following results were obtained.

First, as for the structure of "Comparative Example," the amount of warp in the room temperature was 220 μm and the warp was in a "gabled shape," while the amount of warp subjected to the reflow soldering was 90 μm and the warp was in a "valley shape." On the other hand, as for the structure of "Embodiment," the amount of warp in the room temperature was 25 μm and the warp was almost in a shape of "W," while the amount of warp subjected to the reflow soldering was 18 μm and the warp was almost in a shape of "M."

As can be seen from the results of the experiments, burying at a predetermined position in the package 10 the sheet-shaped member 30 having the modulus of elasticity (larger than 130 GPa but not larger than 500 GPa) and the CTE (10 ppm/K or smaller) within the predetermined ranges makes it possible to suppress the extent of warp (amount of warp) of the board to an allowable value (100 μm or smaller) in any situation, whether the board is in the room temperature or in a temperature region for reflow soldering.

(Second Embodiment, See FIG. 9 and FIGS. 10A-10D)

Figure 9:
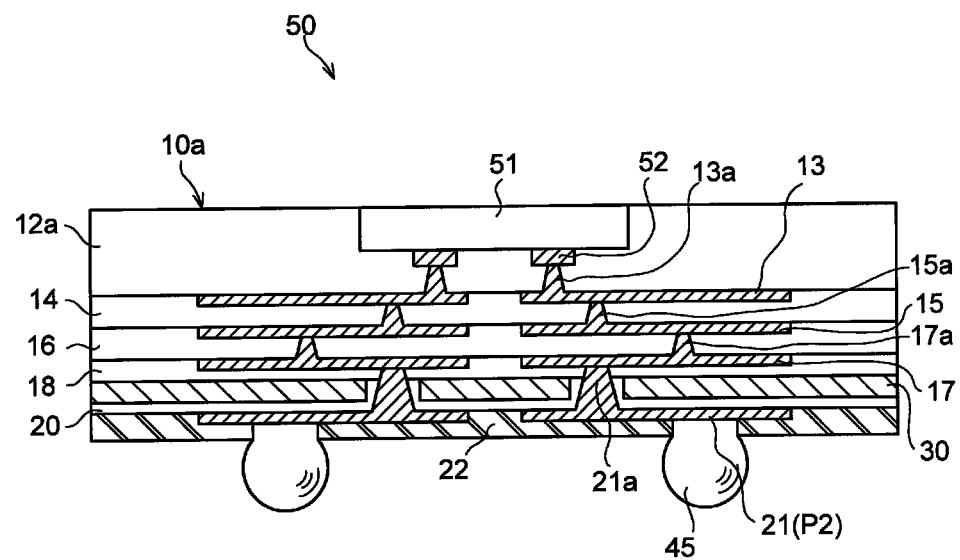
FIG. 9 is a cross-sectional view illustrating a configuration of a semiconductor device using a wiring board (semiconductor package) according to a second embodiment.

FIG. 9 illustrates in a cross-sectional view, a configuration of a semiconductor device using a wiring board (semiconductor package) according to a second embodiment.

The semiconductor device 50 according to the second embodiment is different in configuration from the semiconductor device 40 (FIG. 2) according to the afore-mentioned first embodiment in that the semiconductor device 50 includes a semiconductor element (chip) 51 buried in a wiring board 10a. Specifically, the chip 51 is mounted on an insulating layer 12a which is an outermost layer of the wiring board 10a located on one surface side (side opposite to the side on which the solder resist layer 22 is formed) in such a manner that a back surface (surface on a side opposite to a side on which electrode terminals 52 are formed) of the chip 51 is flush with a top surface of the insulating layer 12a. The electrode terminals 52 are directly connected to vias 13a in the board 10a. For this reason, the insulating layer 12a being the outermost layer has no pads P1 (FIG. 1) for external connection and no solder 23. The insulating layer 12a is thus formed to be thicker than the insulating layer 12 according to the first embodiment, by the thickness of the chip 51. The remaining portion of the configuration (portion corresponding to the package) is basically the same as the configuration of the package (wiring board 10) according to the first embodiment, and thus the description for the other portion will be omitted.

The portion of the package (wiring board 10a) in the semiconductor device 50 according to the embodiment can be manufactured basically in the same manner as the processing performed in the steps (FIG. 3A to FIG. 6C) in the method of manufacturing a wiring board according to the first embodiment. Note that the manufacturing is performed differently in the processing of forming the portion related to the afore-mentioned difference in structure. Thus, the processing related to the different portion will be described below with reference to FIGS. 10A to 10D.

First, in the initial step (see FIG. 10A), the semiconductor element (chip) 51 to be buried in the package (wiring board 10a) is prepared, and is mounted on a temporary substrate (base substrate) BS. The chip 51 to be prepared is fabricated in the following manner.

First, a plurality of devices (active elements such as CPUs) are fabricated in an array form by performing a required device process on one surface side of a silicon wafer of a required size (e.g., 12 inches in diameter and 750 μm in thickness). A passivation film made of silicon nitride (SiN), phospho-silicate glass (PSG), or the like is formed on the surface side on which the devices are formed. Certain portions of the passivation film are removed by laser or the like, the portions corresponding to the portions (electrode pads) of an aluminum wiring layer formed in a required pattern on each of the devices. Thereafter, post-shaped electrode terminals 52 are formed on the electrode pads by copper (Cu) sputtering, copper plating, or performing other processing. The wafer is then ground to a predetermined thickness (e.g., approximately 100 μm to 200 μm), and then diced into devices (of a size of 9 mm×9 mm, for example) using a dicer or the like. In this manner, chips (dies) 51 each having electrode terminals 52 formed on one surface thereof can be obtained.

When the wafer is diced into devices, the wafer is mounted on a dicing tape supported by a dicing frame with a die attach film interposed therebetween in such a manner that a surface of the wafer opposite to the surface on which the devices are fabricated is bonded to the dicing tape. Then, the wafer is cut by a blade of the dicer along lines defining device regions. The chips 51 obtained by cutting and division are each picked up. Here, since each of the chips 51 has the die attach film (not illustrated) bonded on the back surface thereof, the chip 51 is mounted at a predetermined position on the base substrate BS in a face up manner by use of the adhesiveness of the die attach film.

In the next step (see FIG. 10B), an insulating layer 12a is formed on the base substrate BS with the chip 51 mounted thereon in such a manner as to seal the chip 51 (including the portions of the electrode terminals 52). The insulating layer 12a can be formed in the same manner as the processing performed in the step illustrated in FIG. 3C. Although depending on the thickness of the chip 51 to be sealed, the thickness of the insulating layer 12a to be formed is determined in such a manner that the thickness of at least the portions on top of the electrode terminals 52 of the chip 51 are approximately 20 μm to 30 μm.

In the next step (see FIG. 10C), via holes VH3 which respectively extend to the electrode terminals 52 are formed at required positions (portions corresponding to the positions of the electrode terminals 52 of the sealed chip 51) of the insulating layer 12a by a hole making process using a carbon dioxide gas laser, an excimer laser, or the like. Although the via holes VH3 are formed using a laser in this step, required via holes can be formed by photolithography in a case where the insulating layer 12a is made of a photosensitive resin.

In the next step (see FIG. 10D), the wiring layer 13 which is to be connected to the electrode terminals 52 of the chip 51 is formed in a required pattern shape by a semi-additive method, an additive method, or the like, on the insulating layer 12a having the via holes VH3 (FIG. 10C) formed therein, while filling the via holes VH3 with the wiring layer 13 (vias 13a). A specific example will be described as follow.

First, a seed layer is formed on the insulating layer 12a (including inner wall surfaces of via holes VH3) by sputtering, electroless plating, or the like. For example, a seed layer having a two-layer structure is formed by depositing chromium (Cr) or titanium (Ti) by sputtering (to thus obtain a Cr layer or a Ti layer), and further by depositing copper (Cu) thereon by sputtering. Next, a plating resist is formed on the seed layer by use of a patterning material (such as a photo-sensitive dry film similar to the one used in the step illustrated in FIG. 3B), and is then patterned into a required shape to thus form a resist layer. In this respect, the resist layer is patterned in accordance with the shape of the wiring layer 13 to be formed.

Then, the wiring layer 13 (including vias 13a) is formed to a thickness of approximately 5 μm to 10 μm on portions of the seed layer exposed from the opening portions of the resist layer, by electrolytic Cu plating in which the seed layer is used as a power feeding layer. Thereafter, in the same manner as performed in the step illustrated in FIG. 3B, the resist layer is removed.

Figure 10A:
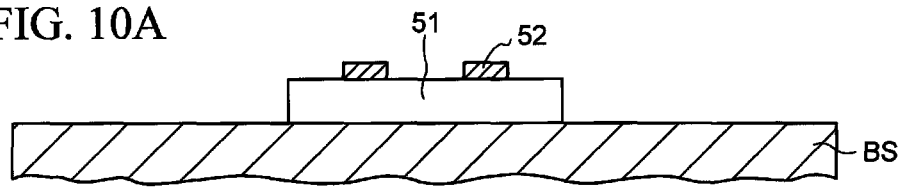
FIGS. 10A to 10D are cross-sectional views illustrating an example of steps for manufacturing the semiconductor device illustrated in FIG. 9.
Figure 10B:
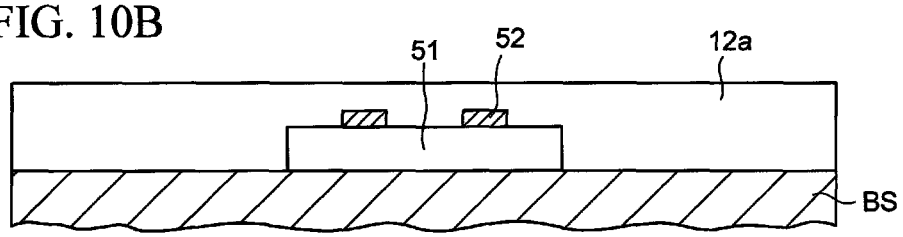
Figure 10C:
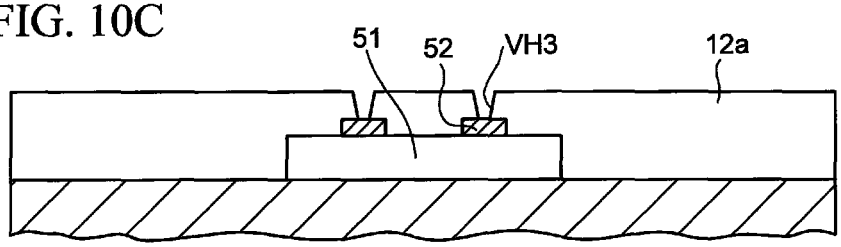
Figure 10D:
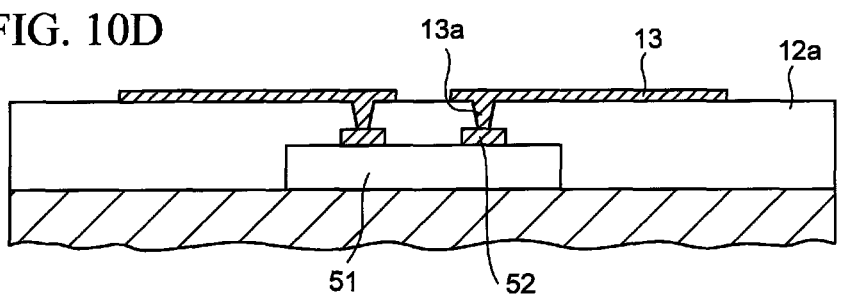

Furthermore, exposed portions of the seed layer are removed by wet etching. In this case, the Cu layer being an upper layer portion of the seed layer is first removed by an etchant which dissolves Cu, and then the Cr layer of the Ti layer being the lower layer portion is removed by an etchant which dissolves Cr or Ti. In this manner, portions of the insulating layer 12a are exposed in accordance with the wiring pattern (of the wiring layer 13) as illustrated in FIG. 10D. Thereafter, a predetermined surface cleansing and the like are performed.

Then, the same processing as the processing performed in the steps illustrated in FIG. 4A to FIG. 6B is performed.

Figure 6A:
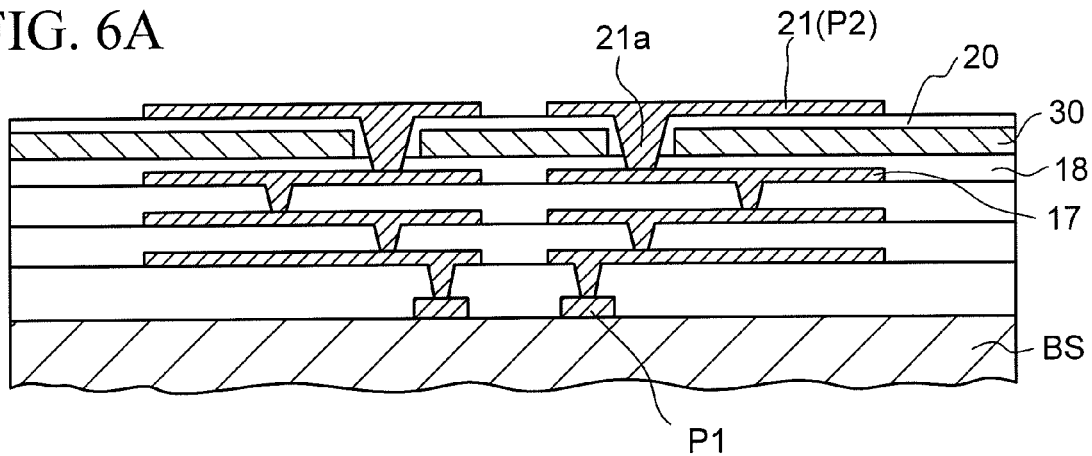
FIGS. 6A to 6C are cross-sectional views illustrating manufacturing steps following the steps illustrated in FIGS. 5A to 5C.
Figure 6B:
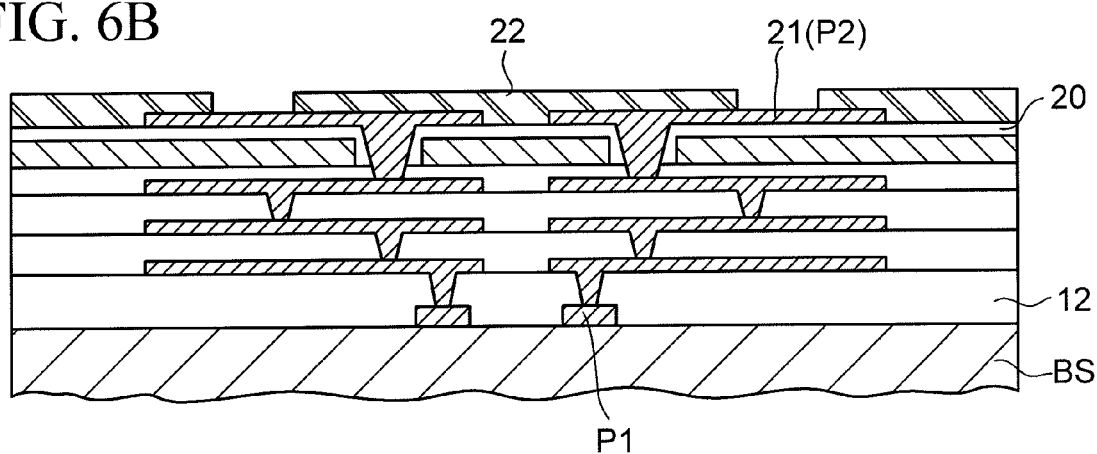
Figure 6C:
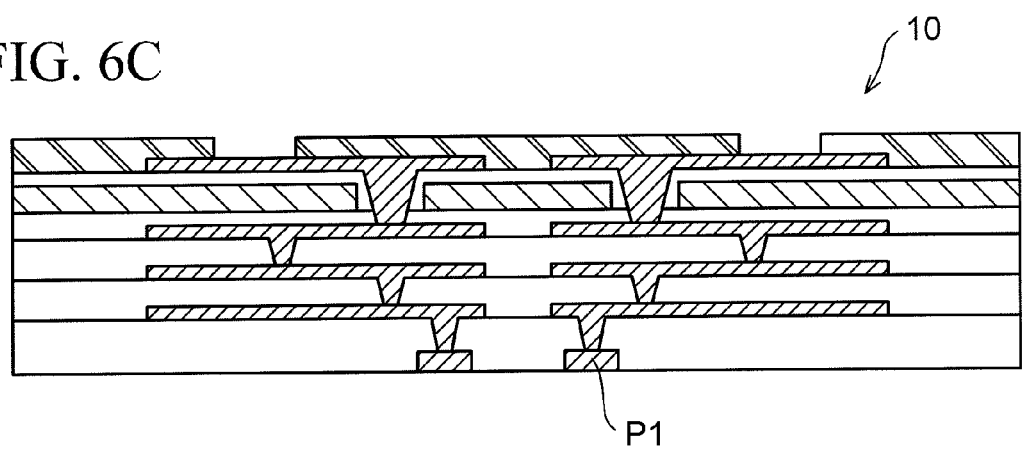

Moreover, the base substrate BS is selectively etched in the same manner as performed in the step illustrated in FIG. 6C. Further, the solder balls 45 (FIG. 9) are bonded to the exposed pads P2 by reflow soldering, and the board 10a is cut and divided into individual devices by use of a dicer or the like. In this manner, the semiconductor device 50 according to the embodiment can be obtained.

As described above, the semiconductor device 50 according to the second embodiment has basically the same configuration as the semiconductor device 40 (FIG. 2) according to the first embodiment, except that the semiconductor element (chip) 51 is buried in the wiring board 10a. Thus the semiconductor device 50 according to the second embodiment is capable of exerting the same effects as those of the semiconductor device 40 according to the first embodiment, with the existence of the sheet-shaped member 30 which is buried at a predetermined position in the board 10a (inside the insulating layer 20 being the outermost insulating layer located on the side opposite to the chip mount surface side) and which has a high modulus of elasticity and a low CTE.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relates to a showing of the superiority and inferiority of the invention. Although the embodiments of the present invention have been described in detail, it should be understood that the various changes, substitutions, and alternations could be made hereto without departing from the spirit and scope of the invention.

What is claimed is:

1. A semiconductor device comprising:
    a laminated structure in which a plurality of wiring layers is stacked in a state that a plurality of insulating layers is interposed therebetween and a first outermost insulating layer is arranged on one side of the laminated structure, and a second outermost insulating layer is arranged on another side of the laminated structure, and the plurality of wiring layers is connected through a plurality of vias formed in the insulating layers, wherein the plurality of wiring layers includes at least an inner wiring layer, an outer wiring layer, and a third wiring layer, wherein the plurality of vias includes at least a first via, a second via and a third via;
    a semiconductor element buried in the first outermost insulating layer, wherein an end face of an electrode terminal, an electrode terminal formation face and a side face of the semiconductor element are coated with the first outermost insulating layer, and a face opposite to the electrode terminal formation face of the semiconductor element is exposed from a surface of the first outermost insulating layer, and
    the second via formed in the first outermost insulating layer is directly connected to the end face of the electrode terminal of the semiconductor element; and
    a sheet-shaped member buried in the second outermost insulating layer, wherein one face of the sheet-shaped member is covered with the second outermost insulating layer, other face of the sheet-shaped member contacts an inner insulating layer, of the plurality of insulating layers, located at an inside of the second outermost insulating layer, the sheet-shaped member having a modulus of elasticity and a coefficient of thermal expansion which are similar to a modulus of elasticity and a coefficient of thermal expansion of the semiconductor element,
    wherein the sheet-shaped member has an opening portion in a part that the first via is arranged, and an outer wiring layer, of the plurality of wiring layers, located at a surface of the second outermost insulating layer is connected to an inner wiring layer, of the plurality of wiring layers, located at an inside of the outer wiring layer by the first via which penetrates the second outermost insulating layer located in the opening portion and the inner insulating layer, and the second outermost insulating layer is formed between a side wall of the opening portion and the first via,
    and all of the plurality of vias has a taper shape such that diameter of the vias decreases gradually from the second outermost insulating layer side toward the semiconductor element side, and
    a thickness of the first outermost insulating layer is thicker than a thickness of the other insulating layers,
    wherein the sheet-shaped member is formed of a member of the group consisting of alloy 42, alloy 36, or kovar, a carbon fiber cloth, and ceramic material.

2. The semiconductor device according to claim 1, wherein the sheet-shaped member is made of a material having a modulus of elasticity and a coefficient of thermal expansion which are enough to bring respective distributions thereof into a substantially symmetric form in a direction orthogonal to a surface of the semiconductor device.

3. The semiconductor device according to claim 1, wherein a surface of the semiconductor element on an opposite side to a side on which an electrode terminal is formed is flush with a surface of the first outermost insulating layer.

4. A semiconductor device according to claim 1, wherein the second via connected to the third wiring layer is directly connected to an electrode terminal of the semiconductor element.

5. A semiconductor device according to claim 1, wherein an electrode terminal formation surface and a side surface of the semiconductor element are covered with the first outermost insulating layer, and a surface of the semiconductor element opposing to the electrode terminal formation surface is exposed to a surface of the first outermost insulating layer.

6. A semiconductor device according to claim 1, wherein a pad is provided on the second outermost insulating layer, and a solder resist which exposes the pad is provided on the second outermost insulating layer.

* * * * *